United States Patent
Pommer

(10) Patent No.: US 6,560,844 B1
(45) Date of Patent: May 13, 2003

(54) ALIGNMENT PLATE WITH MATCHED THERMAL COEFFICIENT OF EXPANSION

(75) Inventor: Richard J. Pommer, Trabuco Canyon, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/512,971

(22) Filed: Feb. 24, 2000

(51) Int. Cl.[7] .............................. B23Q 3/00; H05K 3/36
(52) U.S. Cl. .............................. 29/466; 29/464; 29/467; 29/281.1; 29/830; 269/54.5
(58) Field of Search .................... 29/464, 466, 467, 29/281.1, 596, 609, 732, 738, 829, 830, 846; 269/53, 54.4, 54.5

(56) References Cited

U.S. PATENT DOCUMENTS

| | | | |
|---|---|---|---|
| 4,025,379 A | * | 5/1977 | Whetstone |
| 4,522,667 A | * | 6/1985 | Hanson et al. |
| 4,606,787 A | * | 8/1986 | Pelligrino |
| 4,883,219 A | * | 11/1989 | Anderson et al. |
| 4,967,230 A | * | 10/1990 | Meacham |
| 5,129,933 A | * | 7/1992 | Muragishi et al. |
| 5,199,163 A | * | 4/1993 | Ehrenberg et al. ............ 29/830 |
| 5,527,998 A | * | 6/1996 | Anderson et al. |
| 5,566,840 A | * | 10/1996 | Waldner et al. |
| 5,621,274 A | * | 4/1997 | McGuigan |
| 5,667,128 A | * | 9/1997 | Rohde et al. |
| 5,768,772 A |  | 6/1998 | Buechele ..................... 29/830 |
| 6,204,736 B1 | * | 3/2001 | Logothetis |

FOREIGN PATENT DOCUMENTS

| | | | |
|---|---|---|---|
| DE | 24 44 698 A | | 4/1976 |
| DE | 41 16 543 A1 | | 11/1992 |
| JP | 62082025 | | 4/1987 |
| JP | 03-183970 | * | 8/1991 |
| JP | 04097595 | | 3/1992 |
| JP | 04-206997 | * | 7/1992 |
| JP | 05-218648 | * | 8/1993 |
| JP | 05-249700 | * | 9/1993 |
| JP | 06-177505 | * | 6/1994 |
| JP | 08186376 | | 7/1996 |
| JP | 2000340898 | | 8/2000 |

OTHER PUBLICATIONS

IBM Technical Disclosure Bulletin, "Brazing Boat Capable of Producing Stree Free Hernetically Sealed Substrate Frame Assemblies" Jul. 1979, vol. 22. Issue 2.*
IBM Technical Disclosure Bulletin, "Pedestal Pin Registration System for Multi–Layer Lamination" dated Jan. 1989 pp. 141–142.

* cited by examiner

*Primary Examiner*—Gregory Vidovich
*Assistant Examiner*—Eric Compton
(74) *Attorney, Agent, or Firm*—Rutan & Tucker, LLP; Robert D. Fish; David J. Zoetewey

(57) ABSTRACT

Proper registration between layers of a laminated multi-layer interconnect can be achieved by precisely dimensioning the alignment plate, selecting the materials of which the alignment plate is composed to have the same thermal coefficient of expansion as the layers being laminated, and/or providing the alignment plate with pins sized to be equal to or larger the alignment/registration holes of the layers.

8 Claims, 3 Drawing Sheets

100 providing a plurality of layers to be laminated

200 determining the thermal coefficient of expansion (TCE) of the plurality of layers;

300 providing an alignment plate having approximately the same TCE;

400 stacking the plurality of layers onto the alignment plate

Fig. 3

ALIGNMENT PLATE WITH MATCHED THERMAL COEFFICIENT OF EXPANSION

FIELD OF THE INVENTION

The field of the invention is lamination of dielectric based layers.

BACKGROUND OF THE INVENTION

When laminating multiple layer pairs and bond-plys to form a multiplayer interconnect, it is important to align the layers as well as possible to insure proper registration between layers. One method for doing so involves providing an alignment plate comprising tooling pins and stacking layers to be laminated on the plate so that the plate tooling pins pass through alignment/registration holes in each layer.

Obtaining proper registration is sometimes made more difficult because of the tendency of the alignment plate dimensions to change with changes in temperature of the alignment plate. When the dimensions of the alignment plate change, the spacing between tooling pins changes as well. As a result, a layer may be distorted as a result of being stretched or compressed by such changes in spacing.

To avoid stretching or compressing a layer as the plate's temperature changes, it is possible to utilize registration holes in the layers which are large enough so that changes in positions of the pins simply result in their movement within the registration holes without stretching or compressing the layer. Such a solution is less than desirable, however, as it allows movement of the layers on the pins with such movement making it more difficult to achieve proper registration between layers.

Thus, there is a continuing need for improved lamination methods and devices which minimize registration problems resulting from temperature changes to the alignment plate.

SUMMARY OF THE INVENTION

Methods and apparatus are provided which facilitate proper registration between layers when creating a laminated multi-layered device such and an integrated circuit (IC) interconnect. In particular, proper registration can be achieved by precisely dimensioning the alignment plate, selecting the materials of which the alignment plate is composed to have the same thermal coefficient of expansion (TCE) as the layers being laminated, and/or providing the alignment plate with pins sized to be equal to or larger the alignment/registration holes of the layers.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 3 is a schematic of a method embodying the invention.

DETAILED DESCRIPTION

Figure 1:
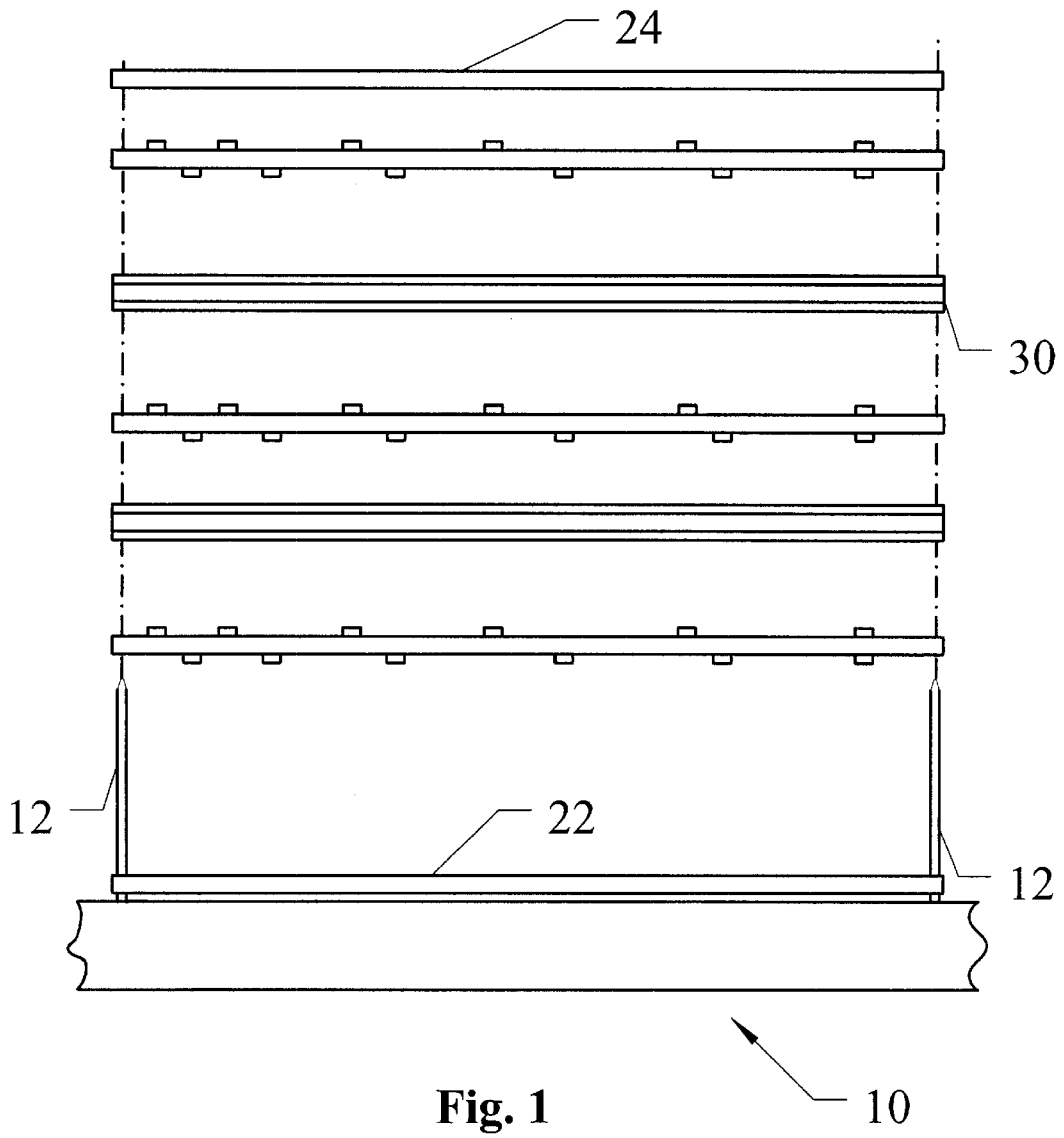
FIG. 1 is a side view of an alignment plate embodying the invention.
Figure 2:
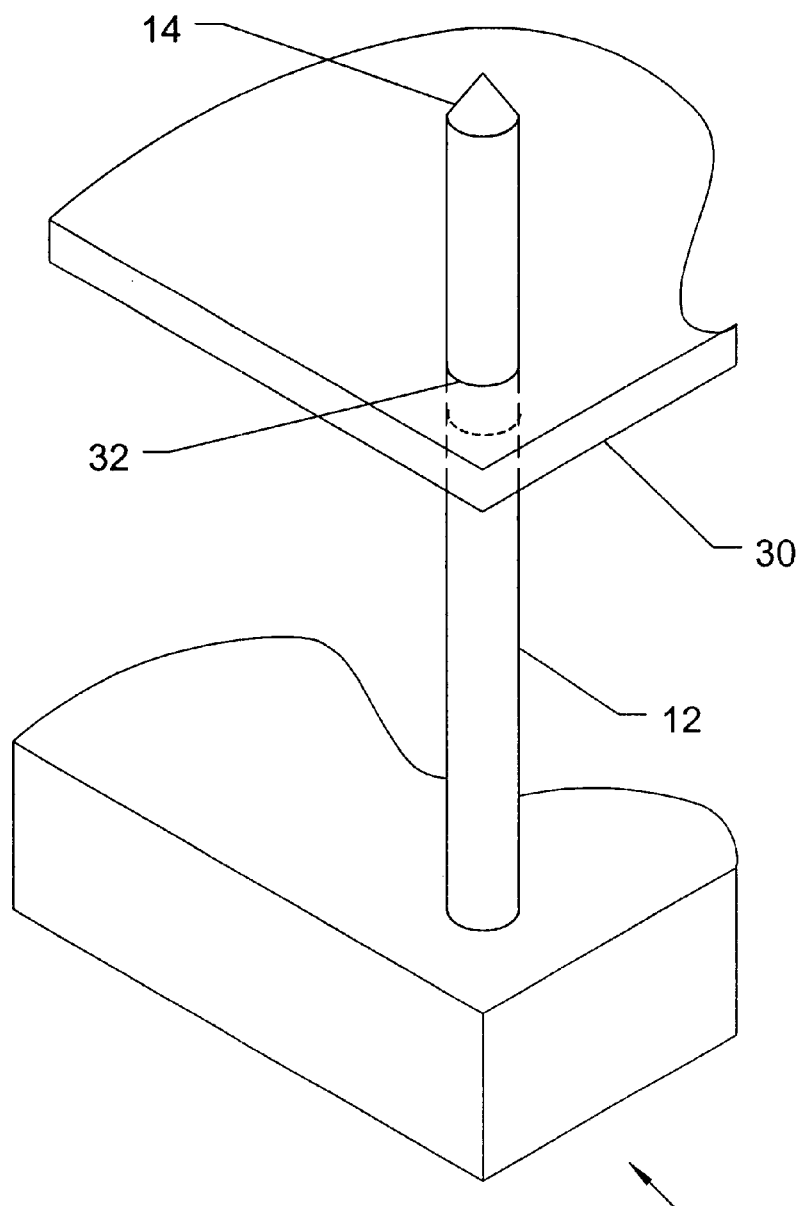
FIG. 2 is a perspective view of an alignment plate embodying the invention.

Referring first to FIGS. 1 and 2, an alignment plate 10 comprises tooling pins 12, and may be used to laminate layers 30, possibly by stacking and sandwiching layers 30 on tooling pins 12 and between release sheets 22 and 24. Alignment plate 10 is preferably constructed from a material having the same or approximately the same thermal coefficient of expansion (TCE) as layers 30. Tooling pins 12 preferably have a diameter equal to or greater than the diameter of alignment holes 32 of layers 30.

Referring to FIG. 3, a preferred method of lamination comprises: step 100, providing a plurality of layers 30 to be laminated; step 200, determining the TCE of the layers 30 to be laminated; step 300, providing an alignment plate 10 having approximately the same TCE, and step 400, stacking the plurality of layers 30 onto the alignment plate 10. If layers 30 and alignment plate 10 have the same TCE, the layers and plate will expand and contract together. In preferred embodiments, an alignment plate 10 will have a TCE close enough to the TCE of the layers as to maintain an alignment of ±5–20 μm. For polyimide film layers, copper alignment plates will likely have TCEs which match the TCEs of the layers sufficiently as to maintain an alignment of ±5–20 μm. Approximately the same as used in regard to the TCEs of the alignment plate 10 and layers 30 simply means that any difference in expansion and contraction of the copper plate 10 relative to layers 30 is small enough so that any misalignment caused by any such difference falls within acceptable bounds. However, it is contemplated that it would be particularly beneficial if the greatest difference between the TCE of alignment plate 10 and the average TCE of the layers be less than 2 ppm (parts per mill).

Preferred methods will also comprise: drilling registration/alignment holes 32 in the layers 30 to be laminated, the registration holes 32 having a diameter no larger than the diameter of the tooling pins 12 of the alignment plate 10. The tooling pins 12 have at least the same diameter as the alignment/registration holes 32 in the layers 30 so as to prevent any movement of the layers 30 once they are positioned on the pins. The need for overly large registration holes to compensate for different rates of expansion between the alignment plate 10 and layers 30 is minimized if layers 30 and alignment plate 10 have similar TCEs. It is contemplated that drilling the registration holes 32 such that their diameters are at least 0–5 μm smaller than the diameter of the tooling pins would be particularly beneficial.

It is also preferred that the materials comprising layers 30 be chosen so that layers 30 have substantially similar TCEs. Having all the layers 30 having substantially similar TCEs prevents distortion of one or more layers 30 because of differences in TCE between layers and between any one layer and the alignment plate 10. Substantially similar as used in regard to the TCEs of the layers simply requires that the individual layers expand and contract similarly enough that any mis-alignment resulting from difference in rates of expansion fall within acceptable bounds. However, it is contemplated that it would be particularly beneficial if the greatest difference in TCE between any two layers is less than 2 ppm.

Applying the disclosed methods to situations in which the tooling pins 12 are larger in diameter than the registration holes 32 will likely require forcing the layers 30 onto the tooling pins 12. Providing tooling pins 12 with conical tips allows a layer to be positioned and to rest on the tooling pins 12 with a portion of the conical tips of tooling pins 12 extending into the registration holes 32 to insure proper alignment of the registration holes 32 and tooling pins 12 prior to forcing the layer onto tooling pins 12.

Thus, specific embodiments and applications of alignment plates have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of laminating comprising:

providing a plurality of layers to be laminated, the layers including a plurality of registration holes;

providing an alignment plate having tooling pins with each tooling pin having a diameter larger than the diameter of any corresponding registration hole;

stacking the plurality of layers onto the alignment plate;

laminating the plurality of layers together to form a laminated stack; and separating the laminated stack from the tooling pins and alignment plate.

2. The method of claim 1 wherein the step of stacking the plurality of layers onto the alignment plate comprises forcing the tooling pins through the registration holes of each layer of the plurality of layers.

3. The method of claim 2 wherein the tooling pins comprise a conical tip and the method further comprises the step of resting each layer of the plurality of layers on the tips of the tooling pins prior to forcing the tooling pins through the registration holes of each layer.

4. The method of claim 3 wherein the diameter of the registration holes is at most 5 $\mu$m smaller than the diameter of the tooling pins.

5. The method of claim 1 wherein the step of providing the plurality of layers comprises providing a plurality of layers, each layer of the plurality of layers having a TCE substantially similar to the TCE of each of the other layers of the plurality of layers.

6. The method of claim 5 wherein the greatest difference in TCE between any two layers is less than 2 ppm.

7. The method of claim 6 wherein the difference in TCE between the alignment plate and the average of the TCEs of the layers is less than 2 ppm.

8. The method of claim 1 further wherein providing an alignment plate comprises determining the thermal coefficient of expansion (TCE) of the plurality of layers and providing an alignment plate having approximately the same TCE.

\* \* \* \* \*